US006780658B2

(12) United States Patent
Livengood et al.

(10) Patent No.: US 6,780,658 B2
(45) Date of Patent: Aug. 24, 2004

(54) METHOD AND APPARATUS FOR CONTROLLING MATERIAL REMOVAL FROM A SEMICONDUCTOR SUBSTRATE USING INDUCED CURRENT ENDPOINTING

(75) Inventors: Richard H. Livengood, San Jose, CA (US); Paul Winer, Santa Clara, CA (US); Gary Woods, Sunnyvale, CA (US); Michael DiBattista, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/455,143

(22) Filed: Jun. 5, 2003

(65) Prior Publication Data

US 2003/0207578 A1 Nov. 6, 2003

Related U.S. Application Data

(60) Continuation of application No. 10/027,368, filed on Dec. 20, 2001, now Pat. No. 6,579,732, which is a division of application No. 09/702,052, filed on Oct. 30, 2000, now Pat. No. 6,355,494.

(51) Int. Cl.[7] .............................................. H01L 21/66
(52) U.S. Cl. ......................................... 438/14; 438/15
(58) Field of Search ..................................... 438/14, 15

(56) References Cited

U.S. PATENT DOCUMENTS

| | | | |
|---|---|---|---|
| 3,755,026 A | * 8/1973 | Reynolds ..................... 438/13 |
| 5,308,161 A | * 5/1994 | Stein ............................... 374/5 |
| 5,413,942 A | * 5/1995 | Cahen et al. ................ 438/468 |
| 5,476,006 A | 12/1995 | Fujii et al. ..................... 73/105 |
| 5,500,188 A | 3/1996 | Hafeman et al. ......... 422/82.02 |
| 5,586,099 A | * 12/1996 | Finkelstein et al. .......... 369/116 |
| 5,790,491 A | * 8/1998 | Jaquette et al. ........... 369/47.53 |
| 5,851,488 A | * 12/1998 | Saul et al. ...................... 422/67 |
| 5,882,598 A | 3/1999 | Lindquist et al. ......... 422/82.02 |
| 5,963,781 A | * 10/1999 | Winer ........................... 438/14 |
| 6,052,401 A | 4/2000 | Wieser et al. ................. 372/74 |
| 6,174,741 B1 | * 1/2001 | Hansch et al. ................ 438/14 |
| 6,282,222 B1 | 8/2001 | Wieser et al. ................. 372/74 |
| 6,355,494 B1 | 3/2002 | Livengood et al. ........... 438/14 |
| 6,370,680 B1 | 4/2002 | Nguyen ....................... 716/19 |
| 2003/0117369 A1 | * 6/2003 | Spitzer et al. .............. 345/156 |
| 2003/0118306 A1 | * 6/2003 | Deliwala .................... 385/125 |
| 2003/0156613 A1 | * 8/2003 | Uenohara et al. ............. 372/46 |

\* cited by examiner

Primary Examiner—Nathan J. Flynn
Assistant Examiner—Olivia T Luk
(74) Attorney, Agent, or Firm—Schwegman, Lundberg, Woessner & Kluth, P.A.

(57) ABSTRACT

A method and apparatus for controlling the removal of material from a semiconductor substrate in an integrated circuit fabrication process is disclosed. The method and apparatus utilize a light source or charged particle beam (electron or ion beam) to induce a current in at least one P-N junction formed in the semiconductor substrate. The induced current is monitored during the removal of material and the process is stopped or endpointed in response to the induced current making a predetermined transition.

37 Claims, 7 Drawing Sheets

US 6,780,658 B2

METHOD AND APPARATUS FOR CONTROLLING MATERIAL REMOVAL FROM A SEMICONDUCTOR SUBSTRATE USING INDUCED CURRENT ENDPOINTING

This application is a continuation of U.S. patent application Ser. No. 10/027,368, filed Dec. 20, 2001, now issued as U.S. Pat. No. 6,579,732, which is a divisional of U.S. patent application Ser. No. 09/702,052, filed on Oct. 30, 2000, now issued as U.S. Pat. No. 6,355,494, which are both incorporated herein by reference.

FIELD OF THE INVENTION

The present invention relates generally to the fabrication of integrated circuits, and more particularly to a method and apparatus for controlling the removal of material from an integrated circuit formed in a semiconductor substrate.

BACKGROUND INFORMATION

In the fabrication of integrated circuits or semiconductor devices, the selective and often partial removal of semiconductor substrate material or the selective and partial removal of a subsequently deposited layer of semiconductor material is often necessary for various reasons. For example, the removal of at least a portion of material in specific areas may be necessary to make electrical contact to underlying components or to an underlying doped semiconductor region by another component or doped region that is to be subsequently deposited or formed on the substrate or on a previously deposited layer of semiconductor material. The precise location of the material to be removed and the quantity of the material, that is the surface area and depth of the material to be removed, are typically very critical to the fabrication process. The precision of these parameters and the accuracy of the removal of material is becoming even more critical as component densities are increasing and the demand for higher yields is also increasing. In contrast, packaging requirements are calling for smaller, more compact structures as consumers demand smaller, lighter weight and more portable electronic devices that have greater functionality.

A current method for determining location and depth for removal of material in the fabrication of semiconductor devices is to drill or etch probe holes into the substrate or semiconductor layer and then measure the depth of penetration with probes at intervals during the etching process. For example, probe holes are used to determine the average silicon thickness and approximate etch rate in a laser chemical etching (LCE) process or focused ion beam (FIB) process. This involves additional process steps in removing the workpiece or integrated circuit being fabricated from the LCE or FIB equipment, drilling or etching the probe holes, if they have not already been formed, and measuring the depth or thickness by inserting probes and measuring the insertion depth. Depending upon the measurement results, the semiconductor device is then painstakingly remounted or realigned with the LCE equipment for additional processing at hopefully, substantially the same exact location. Accordingly, this current method does not permit real time or in situ monitoring and control of the etching process and adds extensive time to the manufacturing process. Additionally, the process involves a certain amount of guess work or trial and error and there is at least some probability of over-etching and damaging the device or other components formed in the substrate. Further, as component densities increase and packaging size requirements shrink, there will be even more limited space to make probe holes.

Accordingly, for all the reasons discussed above, and for other reasons that will become apparent upon reading and understanding the present specification, there is a need for a method and apparatus for monitoring and controlling the removal of material from a semiconductor substrate or integrated circuit that permits real time or in situ monitoring and control of the removal of material and that provides accurate endpointing to discontinue removal of material to prevent damage to the integrated circuit or other components formed within the integrated circuit and to also permits accurate location of the area in which material is to be removed by mapping the location of semiconductor regions formed within the substrate or built up layers of the integrated circuit.

BRIEF DESCRIPTION OF THE DRAWINGS

FIG. 4 B is two graphs showing photocurrent amplitude versus distance along a selected illumination scan line path across the integrated circuit of FIG. 4 B for two different thicknesses of substrate material covering the P and N wells of the integrated circuit in accordance with the present invention.

DETAILED DESCRIPTION OF THE EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
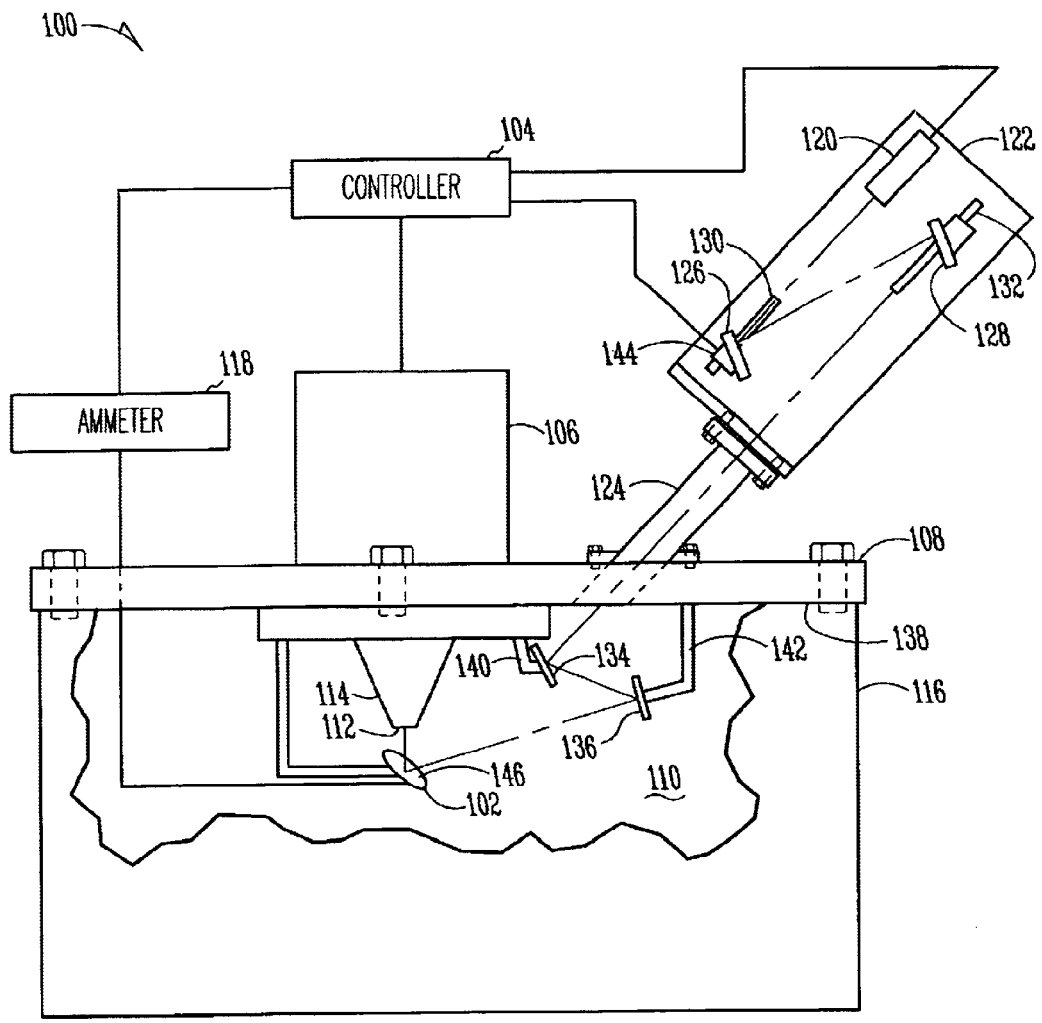
FIG. 1 is an illustration of an apparatus for controlling the removal of material from a semiconductor substrate or integrated circuit in accordance with one embodiment of the present invention.

FIG. 1 is an illustration of one example of an apparatus 100 that may be used for removing material and controlling the removal of material from an integrated circuit or semiconductor substrate 102 in accordance with one embodiment of the present invention. The apparatus 100 is shown conceptually in FIG. 1 and has been simplified to include those components pertinent to the understanding of the present invention. The apparatus 100 includes a controller 104 that is electrically connected to an etching or milling device 106 for doing the actual material removal from the semiconductor substrate 102. The controller 104 may be a microprocessor, central processing unit (CPU), programmable controller or the like. In the example illustrated in FIG. 1, the material removal device 106 is a focused ion beam (FIB) etching or milling device; however, other types of etching or milling equipment could be used as well, such as mechanical or chemical etching, reactive ion etching (RIE) or wet etching ion mill equipment, laser chemical etching equipment or a laser ablation device or the like. While the controller 104 has been shown as a separate component in FIG. 1, the controller 104 may also be an integral part of the etching device 106.

The etching device 106 is removably attached to a lid or cover 108 of an etching chamber 110. An end 112 of the column 114 of the ion beam etching device 106 protrudes through the cover 108 and will extend into the chamber 110 when the cover 108 is attached to a base enclosure portion 116 of the chamber 110 for an etching operation.

The controller 104 is further electrically connected to an ammeter 118 and a light source 120. The light source 120 is preferably a high intensity light source, such as a laser or the like. As will be described in more detail below, in another embodiment of the present invention, a charged particle beam (e.g. ion or electron beam) source may be used with the present invention in place of the light source 120. The light source 120 is removably attached to a fixture 122. The fixture 122 is attached to a viewing port 124 mounted to the cover 108 of the etching chamber 110. A pair of mirrors 126 and 128 are also mounted on the fixture 122. The mirrors 126 and 128 are attached to the fixture 122 by slide rails 130 and 132 that permit adjustment of the mirrors 126 and 128 to focus the light source 120 on a precise, selected location on the semiconductor substrate 102. Another pair of mirrors 134 and 136 are mounted on the underside 138 of the etching chamber cover 108. The mirrors 134 and 136 are also preferably mounted to the cover 108 by fixtures 134 and 136 that permit adjustment of the mirrors to coordinate with mirrors 126 and 128 to facilitate focusing the light source 120 on the selected location on the semiconductor substrate 102.

While the example shown in FIG. 1 uses mirrors to direct the focused light source 120 on the precise, selected location on the semiconductor substrate 102 any arrangement for directing the light source 120 on the semiconductor substrate 102 may be used. For example, a light pipe or fiber optic delivery system may be utilized to direct the energy on the precise, selected location on the semiconductor substrate 102.

In accordance with one embodiment of the present invention, one or more of the mirrors 126, 128, 134 and 136 may be mounted to a motorized gimbal mechanism 144. For this example the motorized gimbal mechanism is shown associated with mirror 126; however, any arrangement that accomplishes the result of controlled scanning of the light source 120 will serve this purpose. Accordingly, the light source 120 can be scanned according to a predetermined path along a surface 146 of the semiconductor substrate 102 to facilitate removal of material in a prefined pattern or to map the underlying semiconductor regions formed in the substrate 102. The gimbal mechanism 144 may be electrically connected to the controller 104. The controller 104 may then be programmed to control the movement of the mirror 126 to coordinate the scanning of the light source 120 with movement of the etching device 106 to remove material according to the predefined pattern or the controller 104 may be programmed to control movement of the mirror 126 to cause the light source 120 to scan along a selected path across the surface 146 of the semiconductor substrate 102 to map the locations of any underlying semiconductor regions as will be described in more detail below.

The apparatus 100 may be a focused ion beam (FIB) model 9800 FC etching chamber as manufactured by the FEI Corporation of Peabody, Mass.

Figure 2:
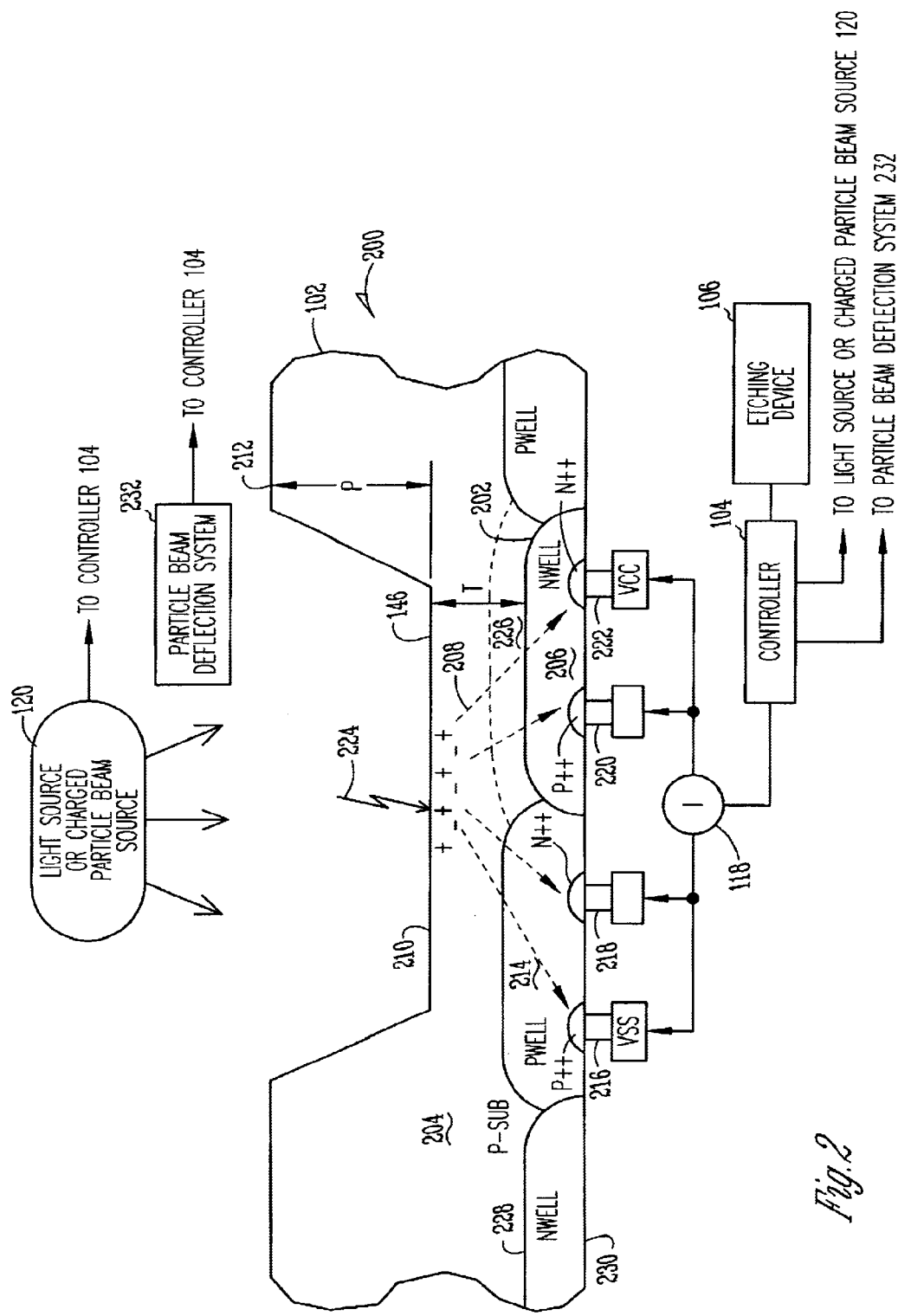
FIG. 2 is a cross-sectional view of an integrated circuit illustrating the method of controlling removal of material from the semiconductor substrate in accordance with one embodiment of the present invention.

FIG. 2 is a detailed cross-sectional view of an example of an integrated circuit 200 formed in the semiconductor substrate 102 and illustrates the method of controlling removal of material from the substrate 102 in accordance with one embodiment of the present invention. The apparatus 100 just described is one example of a device that may be used to remove material and control the material removal process in accordance with the present invention. A P-N junction 202 is formed at the boundary were the P-substrate 204 and N well 206 meet. An induced current or photo current represented by arrows 208 in FIG. 2 will be induced to flow across the P-N junction 202 in response to the light source 120 illuminating at least one portion 210 of a side 212 of the semiconductor substrate 102 or a particle beam source 120 being directed on the at least one portion 210. The negatively charged carriers or electrons represented by the minus (−) signs will be repelled by the N well region 206 and attracted by a P well region 214. Conversely, the positively charged carriers or holes represented by the plus (+) signs will be repelled by the P well region 214 and attracted by the N well region 206 to create the induced current flow 208. Conductive well and substrate taps 216, 218, 220 and 222 are preferably attached to the N and P wells 206 and 214 during the fabrication process of the integrated circuit 200 or similar terminals may be attached to the wells 206 and 214 for making electrical contact to the wells 206 and 214 for testing the integrated circuit 200. In accordance with this example of the present invention, the ammeter 118 is electrically connected to the P well tap 216, labeled VSS, and to the N Well tap 222, labeled VCC. In this manner the ammeter 118 can measure the induced current 208 amplitude across the P-N junction 202 on a real time basis as material is actually being removed from the one portion 210 of the side 212 of the semiconductor substrate 102 by a focused ion beam 224 or other material removal technique previously discussed.

Figure 3:
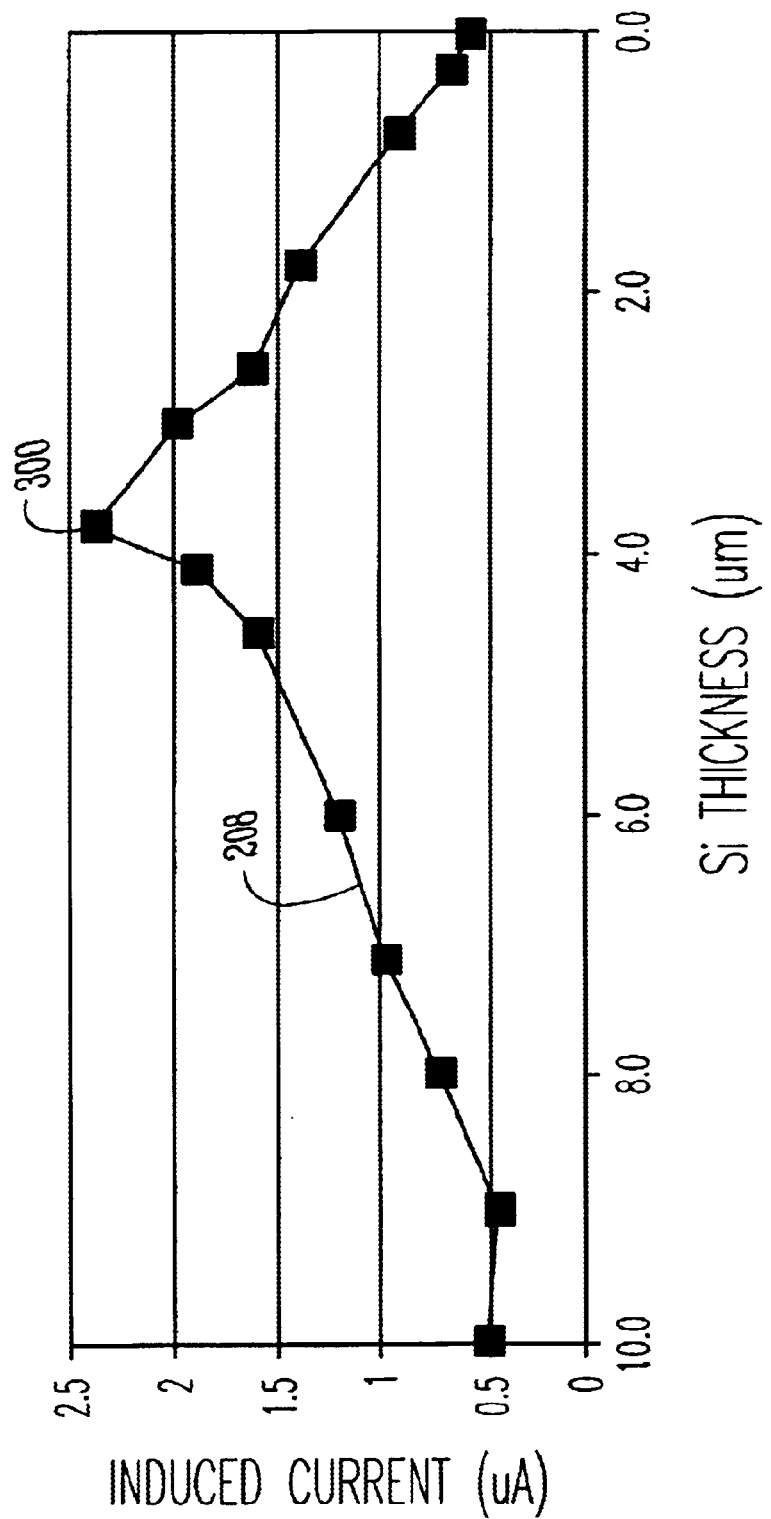
FIG. 3 is a graph of photo current amplitude versus thickness of the semiconductor substrate covering a P-N junction in accordance with one embodiment of the present invention.

Referring also to FIG. 3, FIG. 3 is a graph of the photo current or induced current 208 amplitude versus thickness (T) of the semiconductor substrate 102 material between the P-N junction 202 and the surface 146 of the one portion 210 of the substrate side 212 being etched or milled. As shown in FIG. 3 the photo current or induced current 208 amplitude will increase steeply and rapidly as the semiconductor material is removed and thinned over the N well 206. At a predetermined thickness, the induced current 208 amplitude begins to noticeably deviate from its previous behavior, such as decreasing as shown in FIG. 3. In some circumstances the slope of the induced current 208 curve may be substantially level or constant as more material is removed and then eventually the induced current 208 may begin to decrease in amplitude. As described in more detail herein, the ion beam induced current may vary as a function of the acceleration voltage driving the ion beam, the ion mass of the ion beam and the semiconductor material properties of the substrate 102 and the P and N wells 214 and 206. Similarly, the electron beam induced current may vary as a function of the acceleration voltage and the semiconductor material properties. At the point where the etched, or milled area or portion 210 begins to influence or erode a depletion region 226 of the P-N junction 202, the photo current or induced current 208 amplitude will abruptly stop increasing and begin to change in amplitude as shown in FIG. 3 at reference point 300. For the example shown in FIG. 3 the thickness (T) at which the induced current 208 amplitude makes the transition is about three (3) microns from the active transistor region or depletion region 226. In accordance with at least one embodiment of the present invention, the etching or milling process may be discontinued by the controller 104 when the transition point 300 is detected by the ammeter 118 and the controller 104 to prevent over-etching and possible damage to the active transistor region 226 or damage to other components 228 formed in the semiconductor substrate 102 that are at the same or greater thickness from the milled or etched surface 146 than the depletion region 226 of the P-N junction 202.

The thickness (T) at which the photocurrent transition occurs may be varied from one integrated circuit 200 or semiconductor substrate 102 to another because the photocurrent 208 will be a function of the carrier diffusion properties or length and the light absorption properties or length relative to the distance between the etched surface 146 and the depletion region 226. Accordingly, these physical characteristics or parameters of the semiconductor substrate 102 and the N well 206 and P well 214 regions may be adjusted or controlled in the integrated circuit fabrication process, such as by controlling or adjusting the doping concentration levels of the majority and minority carriers (electrons and holes or negatively charged particles and negatively charged particles) in the substrate 102 and each P and N region 206 and 214, to control the depth (D) or thickness (T) at which the photocurrent transition will occur and at which the milling or etching of the substrate 102 may be endpointed or discontinued.

Similarly, the electron beam or ion beam induced current 208 will be a function of the acceleration voltage driving the electron beam or ion beam, the material properties of the substrate 102, N well 206 and P well 214 and the ion mass of the ion beam. These parameters may be adjusted to control the thickness of the semiconductor substrate covering the P-N junction 202 at which the predetermined change in the induced current 208 amplitude will occur.

Figure 4A:
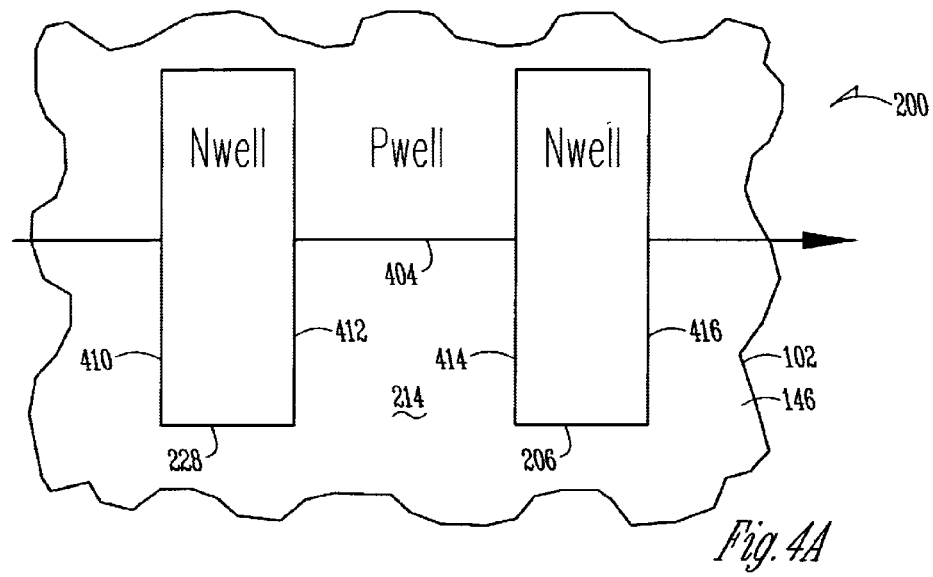
FIG. 4 A is a partial top view of an integrated circuit formed in a semiconductor substrate.
Figure 4B:
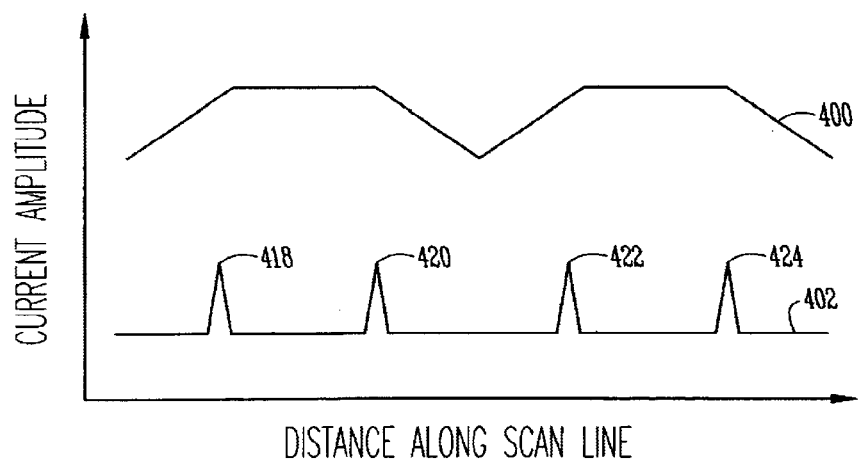

In accordance with another embodiment of the present invention, FIG. 4A shows a partial top view of the integrated circuit 200 formed in the semiconductor substrate 102 and FIG. 4B two graphs or waveforms 400 and 402 of the photo current or induced current amplitude versus distance along a selected or predetermined illumination scan path 404 across the surface 146 of the semiconductor substrate 102 for two different thicknesses of semiconductor substrate material overlying the integrated circuit regions or wells 206, 214 and 228. The integrated circuit 200 as shown in FIG. 4A includes two N well regions 228 and 206 and a P well region 214 disposed between the two N well regions 228 and 206. In accordance with one embodiment of the invention, a light source 120, preferably a high intensity spot light source, such as a laser or the like, is scanned along a selected or predetermined path 404 across the surface 146 of the substrate 102. In accordance with another embodiment of the present invention, a charged particle beam 120 or electron beam or the like is scanned along the selected predetermined path 404 across the surface 146 of the substrate 102. During the scanning procedure, the induced current or photo current amplitude is measured by ammeter 118 and may be plotted as shown in FIG. 4B to provide a map indicating the location of the different wells or regions 228, 214 and 206 beneath the surface 146. This method may therefore be used to determine the exact location to etch or mill the surface 146 to make contact with a particular underlying region 228, 214 or 206 or specific portion or segment of an underlying region 228, 214 or 206.

For the specific example shown in FIG. 4B, the waveform 400 is a plot of the photo current or induced current amplitude for a semiconductor thickness (T) of about 10 microns and the waveform 402 is a plot of photo current or induced current amplitude for a semiconductor thickness (T) of about 2 microns. The waveforms 400 and 402 thus provide an indication of the location of the different regions 228, 214 and 206 at various thicknesses between the substrate surface 146 and the P-N junctions 202 formed by the P-substrate 204 and the N well regions 228 and 206. As the waveform 402 indicates, the photo current or induced current amplitude drops off to about zero when a sufficient amount of material has been removed to influence or erode the active or depletion region 226 of the P-N junction 202; however, the endpoints 410 and 412 of N well 228 and the endpoints 414 and 416 of N well 206 are still evident by the current pulses 418, 420 422 and 424, respectively.

As discussed with respect to FIG. 3, the transition of the photo current or induced current amplitude will be influenced by the physical or material properties of the semiconductor substrate 102 and the P and N regions 206, 214 and 228 for different thicknesses of the overlying semiconductor material. Accordingly, the transitions in the waveforms 400 and 402 may be different depending upon the carrier diffusion properties or length and the light absorption properties and length of the semiconductor regions of the specific integrated circuit being mapped; however, the transitions should still provide an accurate indication of the location of the respective underlying regions.

While the method for mapping underlying semiconductor regions has been described with respect to a specific topology of two N well regions 228 and 206 with a P well region 214 disposed therebetween, it should be noted that the method of the present invention is equally applicable to any topology or layout of semiconductor regions.

Additionally, an electron beam, ion beam or x-ray could be used in place of the high intensity spot light source 120 to scan along the predetermined path 404. The electron beam, ion beam or x-ray will also induce a current in the P-N junctions 202 that can be measured and plotted to provide waveforms similar to waveforms 400 and 402.

In addition to variations in material properties, the induced current waveforms 400 and 402 may also vary as a function of the acceleration voltage driving the ion beam or electron beam and the ion mass of the ion beam. However, the relative changes in the induced current waveforms as the ion beam, electron beam or x-ray are scanned over the different, underlying semiconductor regions should still provide an indication of the relative location of the respective underlying regions.

Figure 5:
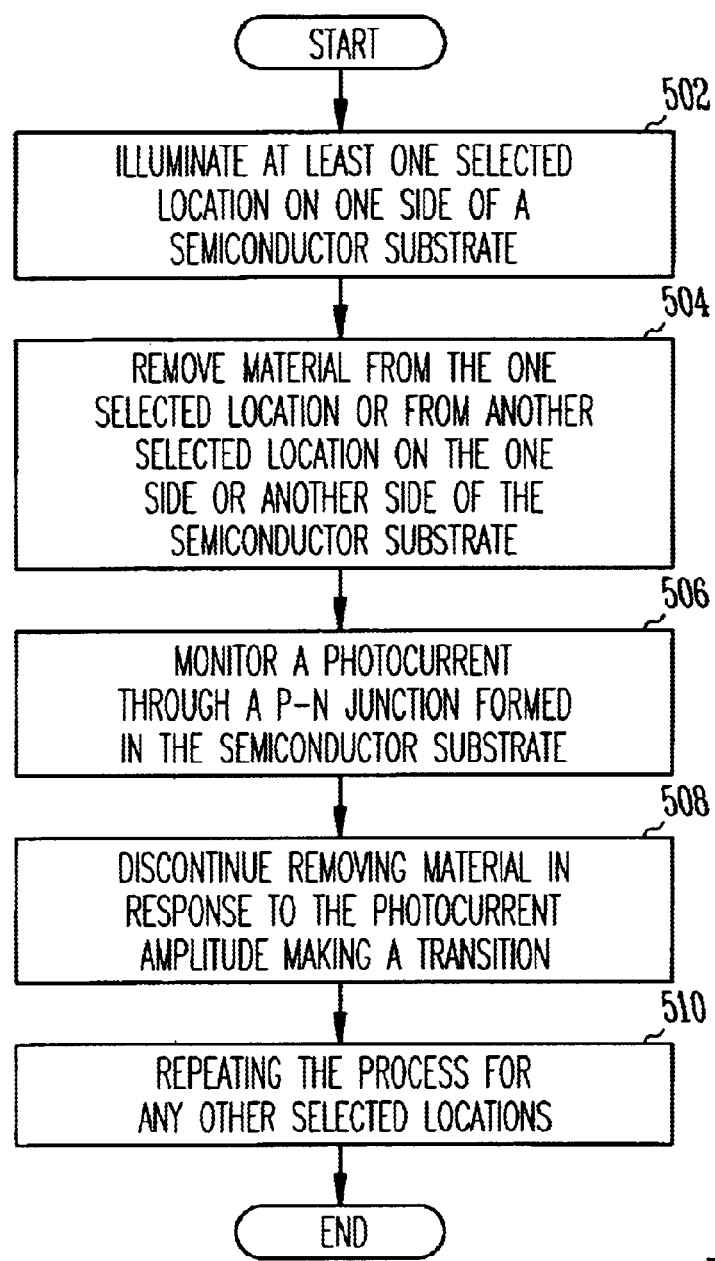
FIG. 5 is a flow chart of a method for controlling removal of material from a semiconductor substrate or integrated circuit in accordance with one embodiment of the present invention.

FIG. 5 is a flow chart of the method for removing and controlling removal of material from a semiconductor substrate 102 or integrated circuit 200 in accordance with one embodiment of the present invention. In action box 502 at least one selected location 210 on one side 212 of the semiconductor substrate 102 is illuminated by the light source 120. The light source 120 may, however, be a broad beam light source to illuminate a larger area or substantially all of the one side 212 or the light source 120 may be a small spot laser that illuminates only a small selected location 210, similar to that described with respect to FIGS. 1 and 2. Material is removed from the one selected location 210 or from another selected location (not shown in the drawings) on the one side 212 or another side 230 of the semiconductor substrate 102, in action box 504, while the at least one selected location 210 is being illuminated by the light source 120. In action box 506 the photocurrent induced through the P-N junction 202 by the photons from the light source 120 is monitored or measured by the ammeter 118. In action box 508 the removal of material by milling or etching is discontinued in response to the photo current amplitude making a transition, such as the photo current amplitude remaining substantially level or constant or the photo current beginning to decrease in amplitude. The process can then be repeated in action box 510 if there are other locations on the semiconductor substrate 102 that need to be etched or milled to a predetermined or selected depth (D) or to have a predetermined thickness (T) of remaining semiconductor material. In another embodiment of the present invention, in action box 502 the light source 120 may be scanned or rastered along a selected path and coordinated with the removal of material in action box 504 to remove material in a predefined pattern to the selected or predetermined depth (D).

Figure 6:
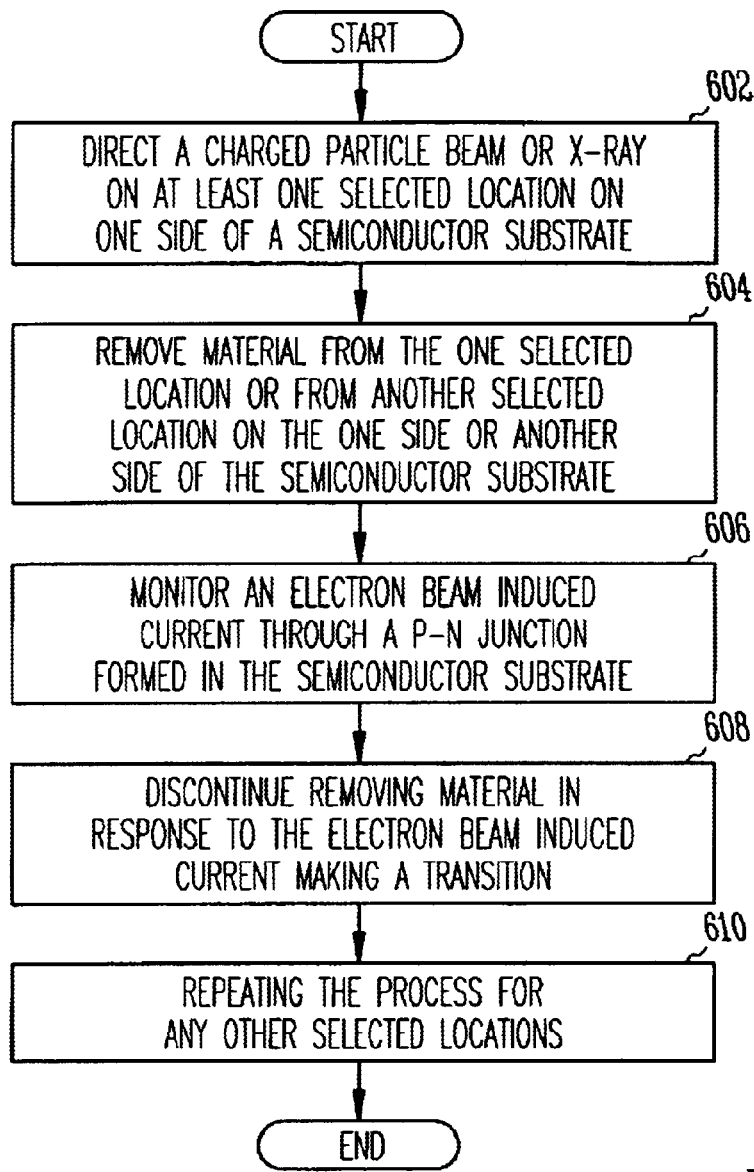
FIG. 6 is a flow chart of a method for controlling removal of material from a semiconductor substrate or integrated circuit in accordance with another embodiment of the present invention.

FIG. 6 is a flow chart of a method for controlling removal of material from a semiconductor substrate 102 or integrated circuit 200 in accordance with another embodiment of the present invention. The method shown in FIG. 6 is similar to that shown in FIG. 5 except that a charged particle beam (e.g. electron beam or ion beam) or x-ray source may be used to induce the current through the P-N junction 202 rather than the light source 120. In action box 602, the charged particle beam or x-ray is directed on at least one selected location 210 on one side 212 of the semiconductor substrate 102. In action box 604 material is removed from the one selected location 210 or from another selected location (not shown in the drawings) on the one side 212 or another side 230 of the semiconductor substrate 102 while the charged particle beam or x-ray is being directed on the at least one selected location 210. The charged particle beam or x-ray induced current through the P-N junction 202 is monitored or measured in action box 606 and in action box 608 the removal of material from the selected location 210 or from the other selected location is discontinued in response to the charged particle beam or x-ray induced current making a transition, such as the induced current remaining substantially the same or the induced current beginning to decrease in amplitude. The process may be repeated in action box 610 for other selected locations on the semiconductor substrate 102. As with the light source 120, the charged particle beam may be scanned or rastered to remove material in a predefined pattern. An electrostatic or magnetic field deflection system 232 (FIG. 2) may be used to scan or raster the charged particle beam.

Figure 7:
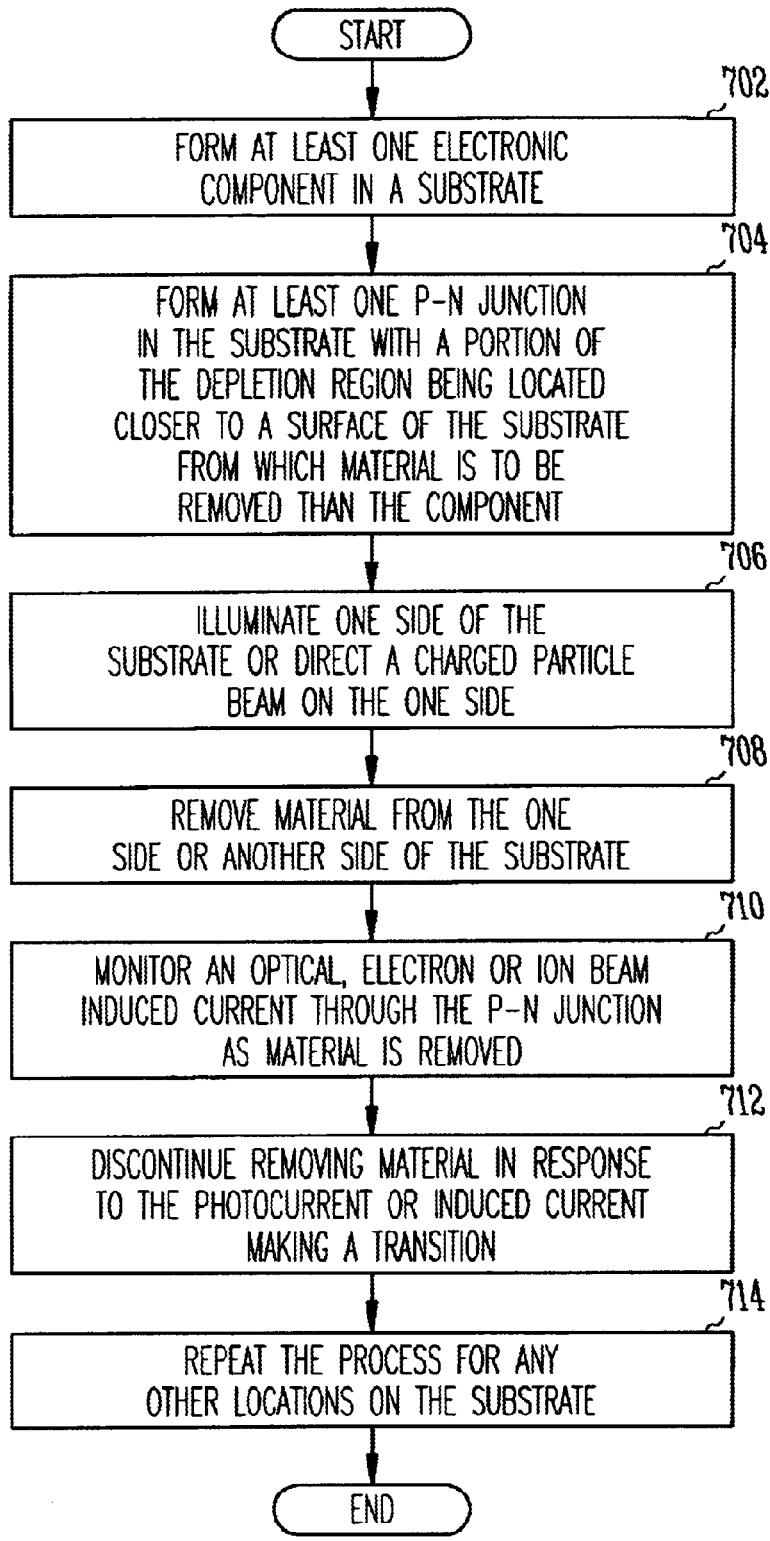
FIG. 7 is a flow chart of a method for making an integrated circuit in accordance with a further embodiment of the present invention.

FIG. 7 is a flow chart of a method for making an integrated circuit in accordance with a further embodiment of the present invention. In action box 702 at least one electronic component, such as P-N junction diode 228, is formed in the semiconductor substrate 102 and in action box 704 at least one P-N junction 202 is formed in the semiconductor substrate 102 with a portion of the depletion region 226 being located closer to a surface 146 of the substrate 102 to be etched than the one electrical component 228. The one side 212 of the substrate 102 is illuminated with a light source 120 or a charged particle beam (ion beam or electron beam) is directed on the one side 212 as provided in action box 706 to induce a current flow through the P-N junction 202. In action box 708 material is removed from a selected location of the one side 212 of the substrate 102 or from another side 230 of the substrate 102 while the light source or particle beam is incident upon the one side 212, and in action box 710 the optical, electron or ion induced current is monitored or measured by the ammeter 118 as material is removed by etching, milling or one of the other techniques described above. In action box 712 the removal of material will be endpointed or discontinued in response to the optical, electron or ion induced current making a noticeable change or transition, such as remaining substantially the same in amplitude or constant or going from increasing in amplitude to decreasing in amplitude. The above described process may then be repeated in action box 714 for any other locations in the substrate 102. As described with respect to FIG. 1 a mechanism such as the gimbal mechanism 144 may be provided to scan the light source 120 or charged particle beam across the one side 212 of the substrate 102 to facilitate removal of material according to a predefined pattern.

While the embodiments of the present invention have been described with respect to inducing a current in a P-N junction and monitoring or measuring the induced current flow through the P-N junction, it should be noted that the current flow could equally have been measured through an N-P junction where the semiconductor substrate 102 was an N-substrate which formed a junction with a P well and the terminals of the ammeter 118 would be connected with the negative terminal connected to the N-substrate or an N well formed in the N-substrate and the positive terminal connected to the P well to provide a positive reading on the ammeter 118.

Accordingly, the present invention provides an efficient and effective method and apparatus for real time monitoring and control of the removal of material from a semiconductor substrate in an integrated circuit fabrication process and discontinuing the material removal before damage to other components contained within the integrated circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of removing material from a semiconductor substrate comprising:
   illuminating a semiconductor substrate with a laser;
   removing material from the semiconductor substrate;
   monitoring a photo current amplitude through a P-N junction formed in the semiconductor substrate; and
   discontinuing removal of material from the semiconductor substrate in response to a predetermined change in the photo current amplitude.

2. The method of claim 1 wherein removing material further comprises removing material from the semiconductor substrate with one of mechanical etching, chemical etching, reactive ion etching (RIE), plasma etching, wet etching, laser ablation, a focused ion beam (FIB), ion mill or laser chemical etching (LCE).

3. The method of claim 1 wherein illuminating further comprises illuminating the semiconductor substrate with a broad beam laser or a small spot beam laser focused by an arrangement of mirrors.

4. The method of claim 1 wherein illuminating further comprises scanning the laser according to a predetermined path along the semiconductor substrate.

5. The method of claim 1 wherein discontinuing removal of material further comprises discontinuing removal of material from the semiconductor substrate when the photo current amplitude changes from substantially increasing to substantially decreasing or remaining substantially the same.

6. The method of claim 5 wherein discontinuing removal of material further comprises discontinuing removal of material from the semiconductor substrate in response to at least a segment of a portion of a depletion region of the P-N junction being removed.

7. The method of claim 1 wherein monitoring a photo current amplitude further comprises monitoring the photo current amplitude through a P-N junction between an N well region in the semiconductor substrate and the semiconductor substrate, the semiconductor substrate comprising a P substrate.

8. The method of claim 7 wherein monitoring a photo current amplitude further comprises monitoring the photo current amplitude with an ammeter coupled between the N well region in the P substrate and a P well region in the P substrate.

9. The method of claim 1 wherein monitoring a photo current amplitude further comprises monitoring the photo current amplitude through a P-N junction between a P well region in the semiconductor substrate and the semiconductor substrate, the semiconductor substrate comprising an N substrate.

10. A method of removing material from a semiconductor substrate, comprising:

illuminating a P substrate with a laser;

removing material from the P substrate;

monitoring a photo current amplitude through a P-N junction between an N well region formed in the P substrate and the P substrate; and discontinuing removal of material from the P substrate in response to a predetermined change in the photo current amplitude.

11. The method of claim 10 wherein removing material further comprises removing material from the P substrate with one of mechanical etching, chemical etching, reactive ion etching (RIE), plasma etching, wet etching, laser ablation, a focused ion beam (FIB), ion mill or laser chemical etching (LCE).

12. The method of claim 10 wherein illuminating further comprises illuminating the P substrate with a broad beam laser or a small spot beam laser focused by an arrangement of mirrors.

13. The method of claim 10 wherein illuminating further comprises scanning the laser according to a predetermined path along the P substrate.

14. The method of claim 10 wherein discontinuing removal of material further comprises discontinuing removal of material from the P substrate when the photo current amplitude changes from substantially increasing to substantially decreasing or remaining substantially the same.

15. The method of claim 14 wherein discontinuing removal of material further comprises discontinuing removal of material from the P substrate in response to at least a segment of a portion of a depletion region of the P-N junction being removed.

16. The method of claim 10 wherein monitoring a photo current amplitude further comprises monitoring the photo current amplitude with an ammeter coupled between the N well region in the P substrate and a P well region in the P substrate.

17. A method of making an integrated circuit comprising:

forming a component in a semiconductor substrate;

forming a P-N junction in the semiconductor substrate;

illuminating the semiconductor substrate with a laser;

removing material from the semiconductor substrate;

monitoring a photo current amplitude through the P-N junction as material is removed from the semiconductor substrate; and discontinuing removal of material from the semiconductor substrate in response to a predetermined change in the photo current amplitude.

18. The method of claim 17 wherein forming a component further comprises forming a P-N junction diode in the semiconductor substrate.

19. The method of claim 17 wherein illuminating further comprises illuminating the semiconductor substrate with a broad beam laser or a small spot beam laser focused by an arrangement of mirrors.

20. The method of claim 17 wherein illuminating further comprises scanning the laser according to a predetermined path along the semiconductor substrate.

21. The method of claim 17 wherein forming a P-N junction in the semiconductor substrate further comprises forming an N well region in the semiconductor substrate, the semiconductor substrate comprising a P substrate with a depletion region between the N well region and the P substrate, a portion of the depletion region being located closer to a surface of the P substrate from which material is removed than the component formed in the P substrate.

22. The method of claim 21 wherein monitoring a photo current amplitude further comprises monitoring the photo current amplitude with an ammeter coupled between the N well region in the P substrate and a P well region in the P substrate.

23. The method of claim 17 wherein forming a P-N junction in the semiconductor substrate further comprises forming a P well region in the semiconductor substrate, the semiconductor substrate comprising an N substrate with a depletion region between the P well region and the N substrate, a portion of the depletion region being located closer to a surface of the N substrate from which material is removed than the component formed in the N substrate.

24. The method of claim 17 wherein discontinuing removal of material further comprises discontinuing removal of material from the semiconductor substrate when the photo current amplitude changes from substantially increasing to substantially decreasing or remaining substantially the same.

25. The method of claim 24 wherein discontinuing removal of material further comprises discontinuing removal of material from the semiconductor substrate in response to at least a segment of a portion of a depletion region of the P-N junction being removed.

26. The method of claim 17, further comprising adjusting carrier diffusion properties in the semiconductor substrate or light absorption properties of the semiconductor substrate to adjust a thickness of the semiconductor substrate when the predetermined change in the photo current amplitude occurs.

27. The method of claim 17 wherein removing material further comprises removing material from the semiconductor substrate with one of mechanical etching, chemical etching, reactive ion etching (RIE), plasma etching, wet etching, laser ablation, a focused ion beam (FIB), ion mill or laser chemical etching (LCE).

28. A method of making an integrated circuit comprising:

forming a component in a P substrate;

forming an N well region in the P substrate;

illuminating the P substrate with a laser;

removing material from the P substrate;

monitoring a photo current amplitude through a P-N junction between the N well region and the P substrate as material is removed; and discontinuing removal of material from the P substrate in response to a predetermined change in the photo current amplitude.

29. The method of claim 28 wherein forming a component further comprises forming a P-N junction diode in the P substrate.

30. The method of claim 28 wherein illuminating further comprises illuminating the P substrate with a broad beam laser or a small spot beam laser focused by an arrangement of mirrors.

31. The method of claim 28 wherein illuminating further comprises scanning the laser according to a predetermined path along the P substrate.

32. The method of claim 28 wherein forming an N well region in the P substrate results in a depletion region between the N well region and the P substrate, a portion of the depletion region being located closer to a surface of the P substrate from which material is removed than the component formed in the P substrate.

33. The method of claim 28 wherein discontinuing removal of material further comprises discontinuing removal of material from the P substrate when the photo current amplitude changes from substantially increasing to substantially decreasing or remaining substantially the same.

34. The method of claim 33 wherein discontinuing removal of material further comprises discontinuing removal of material from the P substrate in response to at least a segment of a portion of a depletion region of the P-N junction being removed.

35. The method of claim 28 further comprising adjusting carrier diffusion properties in the P substrate or light absorption properties of the P substrate to adjust a thickness of the P substrate when the predetermined change in the photo current amplitude occurs.

36. The method of claim 28 wherein monitoring a photo current amplitude further comprises monitoring the photo current amplitude with an ammeter coupled between the N well region in the P substrate and a P well region in the P substrate.

37. The method of claim 28 wherein removing material further comprises removing material from the P substrate with one of mechanical etching, chemical etching, reactive ion etching (RIE), plasma etching, wet etching, laser ablation, a focused ion beam (FIB), ion mill or laser chemical etching (LCE).

* * * * *

UNITED STATES PATENT AND TRADEMARK OFFICE
CERTIFICATE OF CORRECTION

PATENT NO. : 6,780,658 B2
DATED : August 24, 2004
INVENTOR(S) : Livengood et al.

It is certified that error appears in the above-identified patent and that said Letters Patent is hereby corrected as shown below:

Title page,
Item [56], References Cited, U.S. PATENT DOCUMENTS, below "6,370,680" insert
-- 2002/0055272   5/2002   Livengood et al.   438/784 --.

Column 12,
Line 9, after "claim 28" insert -- , --.

Signed and Sealed this

Third Day of May, 2005

JON W. DUDAS
*Director of the United States Patent and Trademark Office*